(12) United States Patent
Maciorowski

(10) Patent No.: US 8,237,579 B2
(45) Date of Patent: Aug. 7, 2012

(54) REFERENCE SIGNAL SYNCHRONIZED TO CLOCK SIGNAL

(75) Inventor: David Maciorowski, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 465 days.

(21) Appl. No.: 12/635,923

(22) Filed: Dec. 11, 2009

(65) Prior Publication Data
US 2011/0140905 A1 Jun. 16, 2011

(51) Int. Cl.
*G08B 7/00* (2006.01)

(52) U.S. Cl. ............... 340/691.8; 340/10.1; 340/10.4; 340/12.4; 340/815.4; 340/686.6; 340/551; 370/352; 370/389; 370/493

(58) Field of Classification Search ............... 340/691.8, 340/10.1, 10.4, 12.5, 551, 686.6, 815.4; 370/352, 370/389, 493
See application file for complete search history.

(56) References Cited

U.S. PATENT DOCUMENTS 7,933,295 B2 * 4/2011 Thi et al. ................... 370/493

* cited by examiner

*Primary Examiner* — Tai T Nguyen

(57) ABSTRACT

A system comprising a clock board comprising a clock generator, a first board comprising an indicator and coupled to said clock board. The clock generator generates a clock signal, and the first board is configured to receive said clock signal. The first board further comprises a clock synchronizing unit that synchronizes a reference signal with said clock signal and generates a blink cadence signal based on said reference signal. The blink cadence signal is configured to drive the indicator of said first board. A failure by said first board to receive said clock signal causes the clock synchronizing unit of said first board to maintain the reference signal and generate said blink cadence signal based on said reference signal.

20 Claims, 2 Drawing Sheets

REFERENCE SIGNAL SYNCHRONIZED TO CLOCK SIGNAL

BACKGROUND

Enterprise-class servers may have multiple boards in a single chassis, with each board having dozens, even hundreds of panel indicator lights. Such panel indicator lights indicate status by being on, off or blinking. Often the status indicator lights blink asynchronously. A user trying to decipher the status displayed by the panel indicator lights of multiple boards may be confused by asynchronously flashing panel indicator lights from one board to another.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
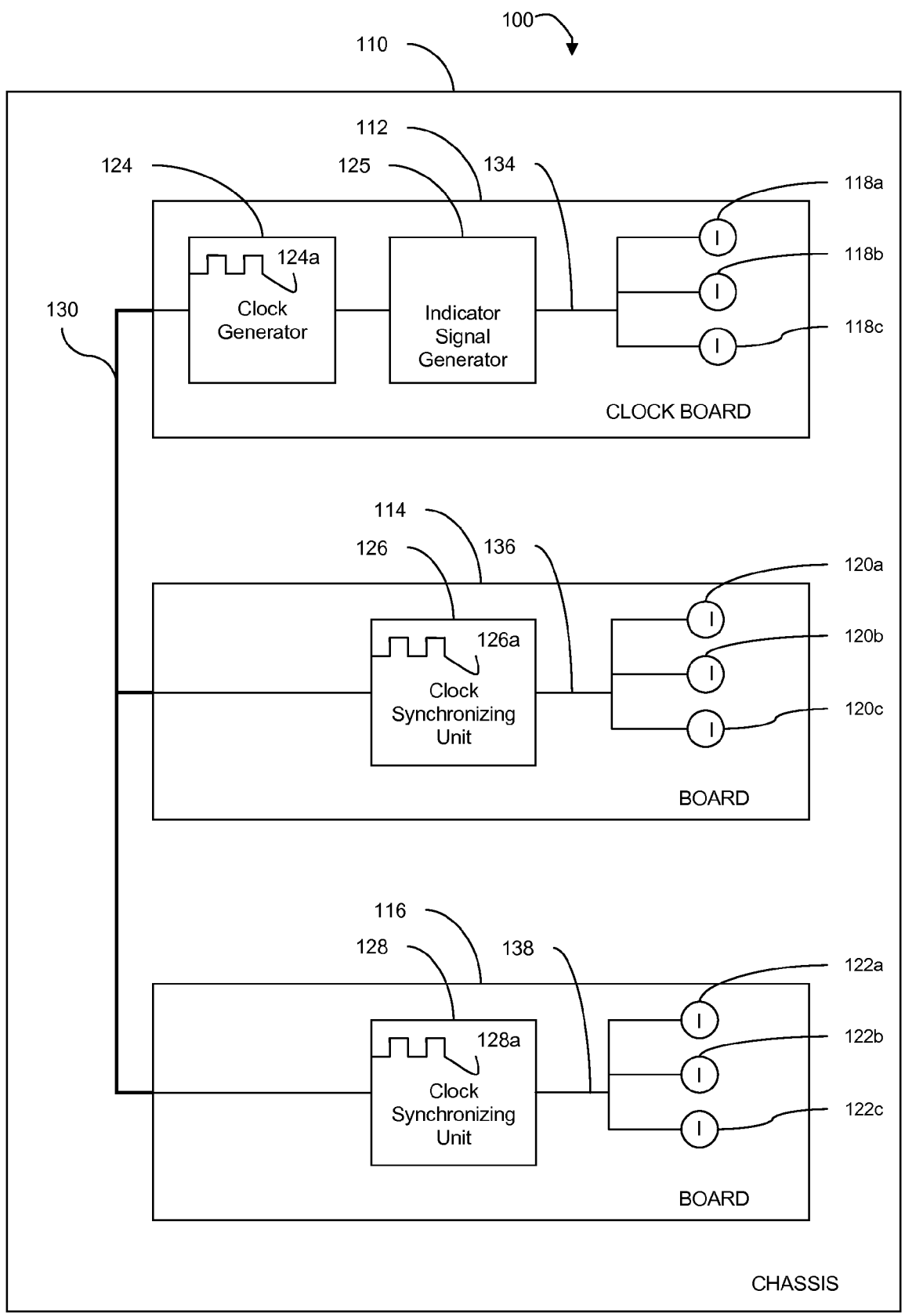
FIG. 1 shows a system in accordance with various embodiments.

FIG. 1 shows a system 100 in accordance with various embodiments. As shown, system 100 comprises a chassis 110 containing clock board 112 coupled to boards 114, 116. In some embodiments, the clock board 112 and the boards 114, 116 comprise blade servers and the chassis 110 comprises a server chassis. The clock board 112 and the boards 114, 116 communicate by way of a wired or wireless communication link 130. In some embodiments the communication link 130 comprises a backplane to which boards 112, 114, 116 mate. In other embodiments, boards 114, 116 are located in a chassis apart from chassis 110, which contains the clock board 112. In such embodiments, the communication link 130 may comprise a wireless communication link.

The clock board 112 comprises or couples to indicators 118a, 118b, 118c and boards 114, 116 comprise or couple to indicators 120a, 120b, 120c and 122a, 122b, 122c, respectively. In some embodiments, the indicators 118a-c, 120a-c, 122a-c comprise a light-emitting diode ("LED") or other type of device that provides a visual cue. The indicators 118a-c, 120a-c, 122a-c may display various status by being solid on, solid off or by blinking. Such status may include whether the board 112, 114, 116 is powered, the health of a signal received by the board 112, 114, 116, whether the board 112, 114, 116 needs attention, or any other status.

The clock board 112 further comprises a clock generator 124 coupled to an indicator signal generator 125. The clock generator 124 and the indicator signal generator 125 may be implemented as a single unit or as separate units on the clock board 112. Boards 114 and 116 further comprise clock synchronizing units 126, 128, respectively. The clock generator 124 is further coupled to the clock synchronizing units 126, 128 by way of the communication link 130. The clock generator 124 may generate a clock signal 124a by a crystal oscillator or other clock-generating device. In some embodiments, the indicator signal generator 125 operates to reduce the frequency of the clock signal 124a to a suitable blink cadence, thereby generating blink cadence signal 134. In some embodiments, the frequency of blink cadence signal 134 operates to turn any of indicators 118a-c displaying a status by blinking on and off at a rate that is suitable for human visual perception (e.g., once per second).

In accordance with various embodiments, the clock synchronizing units 126, 128 comprise digital locked loops (implemented in a field-programmable gate array ("FPGA"), a complex programmable logic device ("CPLD") or other logic device). In some embodiments, the clock synchronizing units 126, 128 receive the clock signal 124a. The receipt of the clock signal 124a (i.e., the clock board 112 is present in the chassis and the communication link 130 is providing the clock signal 124a to boards 114, 116) causes the clock synchronizing units 126, 128 to generate reference signals 126a, 128a respectively, which are synchronized with the clock signal 124a. The clock synchronizing units 126, 128 operate to reduce the frequency of the reference signals 126a, 128a, thereby generating their own blink cadence signals 136 and 138, respectively. The frequency of blink cadence signals 136, 138 may operate to turn any of indicators 120a-c, 122a-c displaying a status by blinking on and off at a rate that is suitable for human visual perception (e.g., once per second).

For example, the frequency of the clock signal 124a (and therefore the reference signals 126a, 128a) may be 100 MHz and the frequency of the blink cadence signals 134, 136, 138 generated by the indicator signal generator 125 and the clock synchronizing units 126, 128 may be 2 Hz. The frequency reduction may be implemented by counting rising edges of the clock signal 124a and generating a rising signal edge (i.e., the blink cadence signal 134, 136, 138) when the count indicates that a certain number of cycles of clock signal 124a (50 million cycles in the 100 MHz to 2 Hz case) have elapsed. Alternatively, the frequency reduction may be implemented by boards 114, 116 by counting rising edges of the reference signal 126a, 128a instead of the clock signal 124a. Any of the indicators 118a-c, 120a-c, 122a-c displaying a status by blinking may use a rising edge of the blink cadence signal 134, 136, 138 to turn on and off, thereby defining the rate at which that particular indicator is blinking.

Additionally, as previously noted, the indicator signal generator 125 generates the indicator signal 134 based on the clock signal 124a. Thus, in such embodiments, the blink cadence signals 134, 136, 138 are synchronized as a result of being based on the clock signal 124a (blink cadence signal 134) and the reference signals 126a, 128a (blink cadence signals 136, 138), which are in turn synchronized with the clock signal 124a.

In accordance with various embodiments, the clock synchronizing units 126, 128 comprise digital locked loops. Thus the clock synchronizing units 126, 128 are able to maintain an oscillating signal internally. If either or both of the clock synchronizing units 126, 128 subsequently fail to receive the clock signal 124a (e.g., if the clock board 112 was removed from the chassis 110 for servicing, or the communication link 130 fails to provide the clock signal 124a), the clock synchronizing units 126, 128 that fail to receive the clock signal 124a continue to maintain reference signals 126a, 128a. Thus, in the event of a failure to receive the clock signal 124a, the clock synchronizing units 126, 128 continue to generate the blink cadence signals 136, 138 based on the reference signals 126a, 128a. In some embodiments, this behavior continues until the clock synchronizing unit 126, 128 receives a rising edge of the clock signal 124a. Receiving the clock signal 124a causes the reference signals 126a, 128a to be synchronized with the clock signal 124a, and blink cadence signals 136, 138 are generated based on the synchronized reference signals 126a, 128a.

In some embodiments, failing to receive the clock signal 124a causes the reference signals 126a, 128a and thus the blink cadence signals 136, 138 to no longer be synchronized. This could be due to variances in manufacturing processes of the clock synchronizing units 126, 128, which in turn causes a variance in the quality of the reference signals 126a, 128a maintained in the absence of the clock signal 124a. However, in such embodiments, the frequency of the clock signal 124a (and therefore the frequencies of the reference signals 126a, 128a) is much greater than the frequencies of the blink cadence signals 136, 138 (e.g., 100 Mz compared to 2 Hz). The frequency response of human visual perception is understood to be much lower than the frequency of the clock signal 124a and the reference signals 126a, 128a. In this way, the blink cadence signals 136, 138 remain substantially synchronized for a period of time. In some embodiments, the indicators 120a-c, 122a-c that are blinking remain synchronized within 5% for a given period of time; typically, long enough so that the cause of the failure to receive the clock signal 124a may be rectified.

For example, if clock synchronizing unit 126 fails to receive the clock signal 124a, the blink cadence signal 136 continues to be generated based on the reference signal 126a. However, the reference signal 126a is no longer synchronized with the clock signal 124a. In this example, the clock synchronizing unit 128 continues to receive the clock signal 124a, and therefore the blink cadence signal 138 is generated based on the reference signal 128a, which remains synchronized with clock signal 124a. Although the blink cadence signals 126a, 128a are no longer synchronized, the indicators 120a-c, 122a-c that are blinking remain substantially synchronized long enough so that a human would not visually detect any of the blinking indicators 120a-c, 122a-c being "out of sync," and the cause of the failure to receive the clock signal 124a may be rectified.

By way of an additional example, if both clock synchronizing units 126, 128 fail to receive the clock signal 124a, the blink cadence signals 136, 138 continue to be generated based on the reference signals 126a, 128a, however the reference signals 126a, 128a are no longer synchronized with the clock signal 124a. Although the blink cadence signals 126a, 128a are no longer synchronized, the indicators 120a-c, 122a-c that are blinking remain substantially synchronized long enough so that a human would not visually detect any of the blinking indicators 120a-c, 122a-c being "out of sync," and the cause of the failure to receive the clock signal 124a may be rectified.

Figure 2:
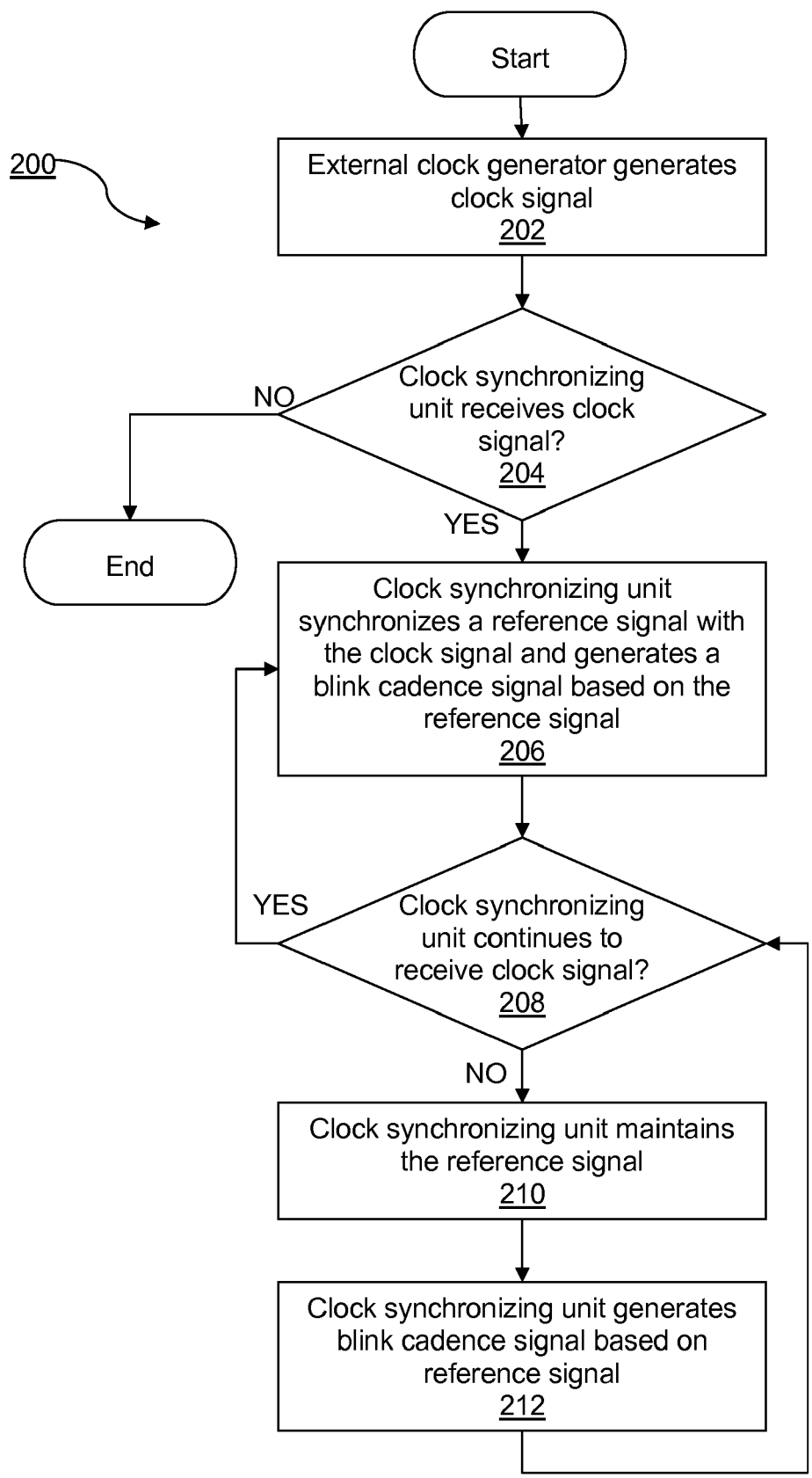
FIG. 2 shows a method in accordance with various embodiments.

FIG. 2 shows a method 200 in accordance with various embodiments. The method is shown with respect to one of the boards 114, 116 (a board other than the clock board 112). The method begins when a clock generator 124 external to the board 114, 116 generates a clock signal 124a (block 202). The clock generator 124 may comprise a crystal oscillator or other clock-generating device.

The method then proceeds to a clock synchronizing unit 126, 128 receiving the clock signal 124a (block 204). In some embodiments, the clock synchronizing unit 126, 128 comprises a digital locked loop (implemented as an FPGA, a CPLD or other logic device). Thus, the clock synchronizing unit 126, 128 is able to maintain an oscillating signal internally. If the clock synchronizing unit 126, 128 fails to receive the clock signal 124a (decision block 204), the method ends. If the clock synchronizing unit 126 receives the clock signal 124a (decision block 204), the clock synchronizing unit 126 synchronizes a reference signal 126a, 128a with the clock signal 124a and generates a blink cadence signal 136, 138 based on the reference signal 126a, 128a (block 206).

In some embodiments, the frequency of the blink cadence signal 136, 138 is much slower (e.g., 2 Hz compared to 100 MHz) than the frequency of the clock signal 124a (and therefore the reference signal 126a, 128a). Further, in some embodiments the board 114, 116 utilizes the clock signal 124a by way of the reference signal 126a, 128a for timing requirements local to the board 114, 116 (e.g., as above, generating the blink cadence signal 136, 138 for indicators 120a-c, 122a-c). Generating the blink cadence signal 136, 138 may be implemented by counting rising edges of the clock signal 124a and generating a rising signal edge (i.e., the blink cadence signal 136, 138) when the count indicates that a certain number of cycles of clock signal 124a (50 million cycles in the 100 MHz to 2 Hz case) have elapsed. Alternatively, the frequency reduction may be implemented by board 114, 116 by counting rising edges of the reference signal 126a, 128a instead of the clock signal 124a. Any of the indicators 120a-c, 122a-c displaying a status by blinking may use a rising edge of the blink cadence signal 136, 138 to turn on and off, thereby defining the rate at which that particular indicator is blinking.

If the clock synchronizing unit 126, 128 continues to receive the clock signal 124a (decision block 208), then control reverts to the clock synchronizing unit 126 synchronizing the reference signal 126a, 128a with the clock signal 124a, and generating the blink cadence signal 136, 138 based on the reference signal 126a, 128a. However, if the clock synchronizing unit 126 fails to receive the clock signal 124a (decision block 208), then the clock synchronizing unit 126, 128 continues to maintain the reference signal 126a, 128a (block 210). Then, the clock synchronizing unit 126, 128 generates the blink cadence signal 136, 138 based on the reference signal 126a, 128a (block 212). In some embodiments, this behavior continues until the clock synchronizing unit 126, 128 receives a rising edge of the clock signal 124a (reversion back to decision block 208). Receiving the clock signal 124a causes the reference signal 126a, 128a to be synchronized with the clock signal 124a, and the blink cadence signal 136, 138 to be generated based on the synchronized reference signal 126a, 128a (block 206).

In some embodiments, failing to receive the clock signal 124a and thus maintaining the reference signal 126a, 128a causes the resulting blink cadence signal 136 to no longer be synchronized with another board's 116 blink cadence signal 138. This could be due to variances in manufacturing processes of the clock synchronizing unit 126, 128, which in turn causes a variance in the quality of the reference signal 126a, 128a maintained in the absence of the clock signal 124a. However, in such embodiments, the frequency of the clock signal 124a (and therefore the frequency of the reference signal 126a, 128a) is much greater than the frequency of the blink cadence signal 136, 138 (e.g., 100 Mz compared to 2 Hz). The rate of human visual perception is understood to be much lower than the frequency of the clock signal 124a. Thus, the point at which any of the indicators 120a-c, 122a-c that are blinking become visually "out of sync" is delayed by a period of time. In this way, the blink cadence signals 136, 138 remain substantially synchronized for a period of time. In some embodiments, the indicators 120a-c, 122a-c that are blinking remain synchronized within 5% for a given period of time; typically, long enough so that the cause of the failure to receive the clock signal 124a may be rectified. In such embodiments, the cause of the failure would be rectified before a human could visually detect any of the blinking indicators 120a-c, 122a-c being "out of sync."

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. A system, comprising:
a clock board comprising a clock generator, said clock generator generates a clock signal; and
a first board coupled to said clock board, said first board comprises an indicator and is configured to receive said clock signal;
wherein said first board further comprises a clock synchronizing unit that synchronizes a reference signal with said clock signal and generates a blink cadence signal based on said reference signal;
wherein said blink cadence signal is configured to drive said indicator of said first board; and
wherein a failure by said first board to receive said clock signal causes said clock synchronizing unit of said first board to maintain said reference signal and generate said blink cadence signal based on said reference signal.

2. The system of claim 1 wherein said blink cadence comprises a frequency and said reference signal comprises a frequency, said frequency of said blink cadence signal is less than said frequency of said reference signal.

3. The system of claim 1 wherein at least one of said clock board and said first board is contained in a blade server.

4. The system of claim 1 wherein said first board couples to said clock board by a server backplane.

5. The system of claim 1 wherein said first board couples to said clock board by a wireless connection.

6. The system of claim 1 wherein said clock synchronizing unit comprises a digital locked loop.

7. The system of claim 1 wherein said clock synchronizing unit comprises a field-programmable gate array.

8. The system of claim 1 further comprising:
a second board coupled to said clock board, said second board comprises an indicator and is configured to receive said clock signal;
wherein said second board further comprises a clock synchronizing unit that synchronizes a reference signal with said clock signal and generates a blink cadence signal based on said reference signal;
wherein said blink cadence signal is configured to drive said indicator of said second board; and
wherein a failure by said second board to receive said clock signal causes said clock synchronizing unit of said second board to maintain said reference signal and generate said blink cadence signal based on said reference signal.

9. The system of claim 8 wherein synchronizing each of said reference signals with said clock signal and generating each of said blink cadence signals based on said reference signals causes said blink cadence signal of said first board to be synchronized with said blink cadence signal of said second board.

10. The system of claim 8 wherein maintaining one or more of said reference signals and generating one or more of said blink cadence signals based on said maintained reference signals causes said blink cadence signal of said first board to be substantially synchronized with said blink cadence signal of said second board.

11. A method comprising:
generating, by a clock generator coupled to a clock board, a clock signal;
receiving, by a first board comprising a clock synchronizing unit, said clock signal;
synchronizing, by said clock synchronizing unit, a reference signal with said clock signal;
generating, by said clock synchronizing unit, a blink cadence signal based on said reference signal; and
driving, by said blink cadence signal, an indicator of said first board;
wherein a subsequent failure to receive said clock signal by said clock synchronizing unit causes maintaining a reference signal by said clock synchronizing unit and generating said blink cadence signal based on said maintained reference signal by said clock synchronizing unit.

12. The method of claim 11 wherein said first board maintaining said reference signal comprises maintaining said reference signal using a field-programmable gate array.

13. The method of claim 11 wherein receiving said clock signal comprises receiving said clock signal by a server backplane.

14. The method of claim 11 further comprising:
receiving, by a second board comprising a clock synchronizing unit, said clock signal;
synchronizing, by said clock synchronizing unit of said second board, a reference signal with said clock signal;
generating, by said clock synchronizing unit of said second board, a blink cadence signal based on said reference signal; and
driving, by said blink cadence signal, an indicator of said second board;
wherein a subsequent failure to receive said clock signal by said clock synchronizing unit of said second board causes maintaining a reference signal by said clock synchronizing unit of said second board and generating said blink cadence signal based on said maintained reference signal by said clock synchronizing unit of said second board.

15. The method of claim 14 wherein synchronizing each of said reference signals based on said clock signal causes said blink cadence signal of said first board to be synchronized with said blink cadence signal of said second board.

16. The method of claim 14 wherein generating one or more of said blink cadence signals based on said maintained reference signals causes said blink cadence signal of said first board to be substantially synchronized with said blink cadence signal of said second board.

17. An apparatus comprising:
a chassis;
a plurality of computer boards installed in said chassis;
a clock signal received by each of said plurality of computer boards;
a clock synchronizer on each of said plurality of computer boards wherein each clock synchronizer synchronizes a reference signal with said clock signal and generates a blink cadence signal based on said reference signal such that each blink cadence signal is synchronized with all other blink cadence signals;
at least one indicator on each of said plurality of computer boards configured to receive one of said blink cadence signals and display a status by blinking synchronously with said blink cadence signal, thereby defining an indicator blink rate.

18. The apparatus of claim 17 wherein synchronizing each of said reference signals with said clock signal and generating each of said blink cadence signals based on said reference signals causes each indicator blink rate to be synchronized with all other indicator blink rates.

19. The apparatus of claim 17 wherein a failure by one or more of said plurality of computer boards to receive said clock signal causes said clock synchronizing unit of said one or more boards experiencing said failure to maintain said reference signal and generate said blink cadence signal based on said reference signal.

20. The apparatus of claim 19 wherein maintaining one or more of said reference signals and generating one or more of said blink cadence signals based on said maintained reference signals causes each indicator blink rate to be substantially synchronized with all other indicator blink rates.

* * * * *